United States Patent
Hwu et al.

(10) Patent No.: US 8,909,544 B2
(45) Date of Patent: Dec. 9, 2014

(54) METHOD FOR ENCODING OR DECODING DIGITAL DATA, DATA DISSEMINATING DEVICE AND DATA MANAGING DEVICE

(75) Inventors: Jing-Shyang Hwu, Zhubei (TW);
Yung-Hsiang Liu, Keelung (TW);
Fu-Kuo Tseng, Hsinchu (TW);
Rong-Jaye Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 589 days.

(21) Appl. No.: 13/210,257

(22) Filed: Aug. 15, 2011

(65) Prior Publication Data

US 2012/0163445 A1     Jun. 28, 2012

(30) Foreign Application Priority Data

Dec. 27, 2010   (TW) ............................... 99146172 A

(51) Int. Cl.
*G06Q 30/00*     (2012.01)
*H04L 1/00*      (2006.01)

(52) U.S. Cl.
CPC ....... *H04L 1/0076* (2013.01); *H04L 2001/0092* (2013.01)
USPC ................... 705/14.41; 705/14.62; 705/14.49

(58) Field of Classification Search
USPC ................. 705/14.41, 14.62, 14.49
See application file for complete search history.

(56) References Cited

U.S. PATENT DOCUMENTS

| | | | | |
|---|---|---|---|---|
| 4,672,605 A * | 6/1987 | Hustig et al. ................. | 370/201 |
| 5,355,412 A * | 10/1994 | Kangas ......................... | 713/161 |
| 5,404,377 A * | 4/1995 | Moses .......................... | 375/145 |
| 5,473,631 A * | 12/1995 | Moses .......................... | 375/130 |
| 5,835,393 A * | 11/1998 | Melanson et al. ............ | 708/628 |
| 5,917,852 A | 6/1999 | Butterfield et al. | |
| 6,035,177 A * | 3/2000 | Moses et al. .................... | 725/22 |
| 6,201,811 B1 * | 3/2001 | Larsson et al. ............. | 370/310.1 |
| 6,496,104 B2 * | 12/2002 | Kline ............................ | 375/259 |
| 6,625,734 B1 * | 9/2003 | Marvit et al. .................. | 726/28 |
| 6,738,349 B1 * | 5/2004 | Cen .................................. | 370/231 |
| 6,829,635 B1 * | 12/2004 | Townshend .................... | 709/206 |
| 6,871,313 B2 * | 3/2005 | Gopalakrishnan ........... | 714/774 |
| 7,206,814 B2 * | 4/2007 | Kirsch .......................... | 709/206 |
| 7,366,761 B2 * | 4/2008 | Murray et al. ................ | 709/206 |

(Continued)

FOREIGN PATENT DOCUMENTS

| CN | 1266567 A | 9/2000 |
|---|---|---|
| CN | 1449158 | 10/2003 |

(Continued)

OTHER PUBLICATIONS

Lee, S.B., et al.; "Secure Incentives for Commercial Ad Dissemination in Vehicular Networks;" 2007; pp. 150-159.

Buttyan, L., et al.; "Stimulating Cooperation in Self-Organizing Mobile Ad Hoc Networks;" Mobile Networks and Applications 8; 2003; pp. 579-592.

Zhong, S., et al.; "Sprite: A Simple, Cheat-Proof, Credit-Based System for Mobile Ad-Hoc Networks;" IEEE Infocom; 2006; pp. 1-11.

(Continued)

*Primary Examiner* — Joseph D Torres
(74) *Attorney, Agent, or Firm* — McClure, Qualey & Rodack, LLP

(57) ABSTRACT

A method for encoding or decoding digital data, a data dissemination device and a data managing device are provided. The method for encoding digital data includes the following steps. A digital data is received. A sign data is encoded into the digital data through a linear combination operation to obtain an encoded digital data, wherein the size of the digital data is not changed after the encoding process. The encoded digital data is disseminated.

8 Claims, 3 Drawing Sheets

(56) References Cited

U.S. PATENT DOCUMENTS

| | | | |
|---|---|---|---|
| 7,603,715 B2 * | 10/2009 | Costa et al. | 726/25 |
| 7,681,235 B2 * | 3/2010 | Chesla et al. | 726/23 |
| 7,734,278 B2 | 6/2010 | Jayapalan et al. | |
| 2003/0229893 A1 * | 12/2003 | Sgaraglino | 725/37 |
| 2006/0021054 A1 * | 1/2006 | Costa et al. | 726/25 |
| 2008/0181413 A1 | 7/2008 | Yi et al. | |
| 2009/0028323 A1 * | 1/2009 | Aciicmez et al. | 380/28 |

FOREIGN PATENT DOCUMENTS

| | | |
|---|---|---|
| CN | 2785271 Y | 5/2006 |
| CN | 101047618 A | 10/2007 |
| WO | 0150675 A2 | 7/2001 |
| WO | 2007007214 A1 | 1/2007 |

OTHER PUBLICATIONS

He, Q., et al.; "SORI: A Secure and Objective Reputation-Based Incentive Scheme for Ad-hoc Networks;" IEEE Communications Society; 2004; pp. 825-830.

Zhang, Y., et al.; "A Secure Incentive Protocol for Mobile Ad Hoc Networks;" May 8, 2006; pp. 569-582.

TW Office Action dated Mar. 24, 2014.

CN Office Action dated Dec. 10, 2013.

English Abstract translation of CN2785271Y (Published May 31, 2006).

CN Office Action dated Aug. 13, 2014.

Full English (machine) translation of CN101047618 (Published Oct. 3, 2007).

Full English (machine) translation of CN1449158 (Oct. 15, 2003).

* cited by examiner

METHOD FOR ENCODING OR DECODING DIGITAL DATA, DATA DISSEMINATING DEVICE AND DATA MANAGING DEVICE

This application claims the benefit of Taiwan application Serial No. 099146172, filed Dec. 27, 2010, the subject matter of which is incorporated herein by reference.

BACKGROUND

1. Technical Field

The disclosure relates in general to a method for encoding or decoding digital data capable of tracking data dissemination device, a data dissemination device and a data managing device.

2. Description of the Related Art

Along with the advance in the digital network technology, a wireless ad-hoc network is provided. The wireless ad-hoc network is a distributed network system, and each node of the wireless ad-hoc network is able to disseminate network packages to other nodes instead of depending on an existing network framework (such as a router or a wireless access point). Thus, the wireless ad-hoc network is formed through the dynamic connection between the nodes.

However, due to the properties of the wireless ad-hoc network, it is really difficult to track a data after the data is already disseminated between the nodes. The current tracking methods consume a huge amount of network resources, and at the same, the verification data may be easily destroyed.

SUMMARY

The disclosure is directed to a method for encoding or decoding digital data capable of tracking data dissemination device, a data dissemination device and a data managing device.

According to a first aspect of the present disclosure, a method for encoding digital data capable of tracking data dissemination device is provided. The method for encoding digital data includes the following steps. A digital data is received. A sign data is encoded into the digital data through a linear combination operation to obtain an encoded digital data, wherein the size of the digital data is not changed after the encoding process. The encoded digital data is disseminated.

According to a second aspect of the present disclosure, a method for decoding digital data capable of tracking data dissemination device is provided. The method for decoding digital data includes the following steps. A digital data is received. A correct codeword is decoded from the digital data by a decoding algorithm of a linear code, and at least an error position of an error digit is identified, wherein the error position denotes a sign data. At least a data dissemination device is tracked according to the error position.

According to a third aspect of the present disclosure, a data dissemination device is provided. The data dissemination device includes a reception unit, an encoding operation unit and a dissemination unit. The reception unit is used for receiving a digital data. The encoding operation unit is used for encoding a sign data into the digital data through a linear combination operation to obtain an encoded digital data, wherein the size of the digital data is not changed after the encoding process. The dissemination unit is used for disseminating the encoded digital data.

According to a fourth aspect of the present disclosure, a data managing device is provided. The data managing device includes an input unit, a decoding operation unit and a tracking unit. The input unit is used for inputting a digital data. The decoding operation unit is used for decoding a correct codeword from the digital data by a decoding algorithm of a linear code and identifying at least an error position of an error digit, wherein the error position denotes a sign data. At least a data dissemination device is tracked according to the error position.

The above and other aspects of the disclosure will become better understood with regard to the following detailed description of the non-limiting embodiment(s). The following description is made with reference to the accompanying drawings.

DETAILED DESCRIPTION

Figure 1:
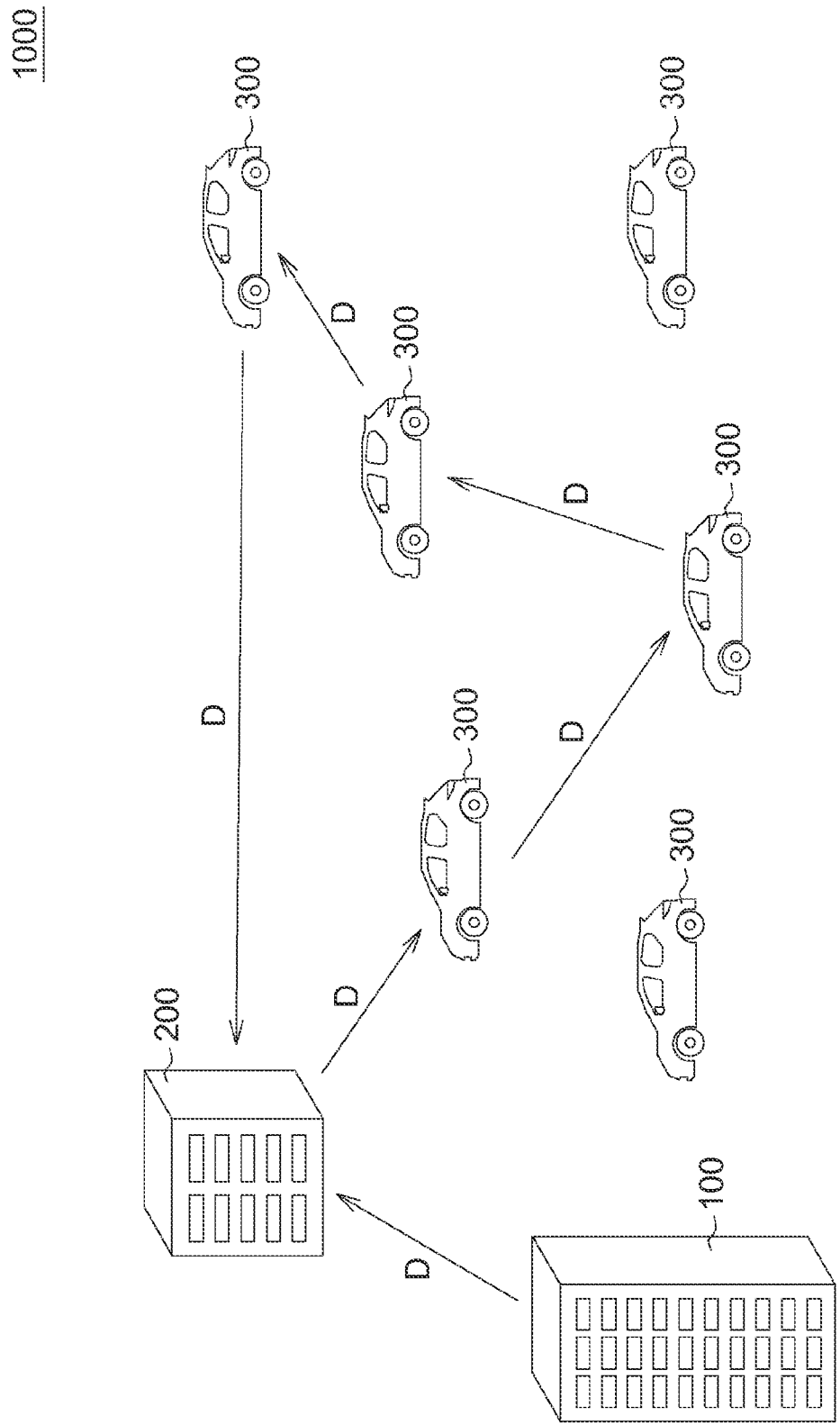
FIG. 1 shows a data disseminating system according to an embodiment of the present disclosure.

Referring to FIG. 1, a data disseminating system 1000 according to an embodiment of the present disclosure is shown. The data disseminating system 1000, realized by such as a wireless ad-hoc network, includes a data providing device 100, a data managing device 200 and a number of data dissemination devices 300. The data providing device 100 is realized by such as an operating computer of an advertisement commissioner. The data managing device 200 is realized by such as a server of an advertisement company. The data dissemination devices 300 are realized by such as vehicular computers whose owners are willing to participate in data dissemination.

A digital data D with advertisement can be disseminated as follows. Firstly, the digital data D is provided to the data managing device 200 by the data providing device 100. Next, the digital data D is disseminated to one of the data dissemination devices 300 by the data managing device 200. Then, the digital data D is disseminated to another data dissemination device 300 by the data dissemination device 300 (without involving the data managing device 200). Wherein, each time before the digital data D is disseminated (including the time before the digital data D is first disseminated to one of the data dissemination devices 300 by the data managing device 200), a coding procedure is executed to encode a sign data S (illustrated in FIG. 2) into the digital data D. Consequently, a number of sign data S (at least includes the sign data of the data managing device 200) are concealed in the digital data D, wherein these sign data S indicate which data dissemination devices 300 assist in the dissemination of data. Therefore, the data managing device 200 will know which data dissemination devices 300 assist in the dissemination of the digital data D by executing decoding procedures to the digital data D.

Figure 2:
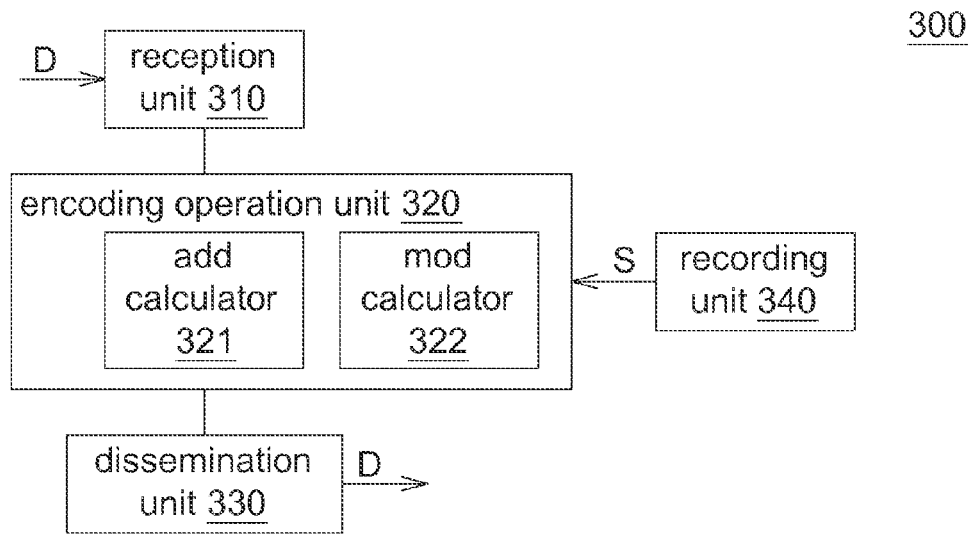
FIG. 2 shows a block diagram of a data dissemination device.

Referring to FIG. 2, a block diagram of a data dissemination device 300 is shown. Let the data dissemination devices 300 be taken for example. Each data dissemination device 300 includes a reception unit 310, an encoding operation unit 320, a dissemination unit 330 and a recording unit 340. The reception unit 310 is used for receiving any type of data. The dissemination unit 330 is used for disseminating any type of data. The reception unit 310 and the dissemination unit 330 can be realized by such as a cabled network module, a wireless network module or a wireless disseminating module. The encoding operation unit 320 is used for executing a coding procedure, and can be realized by such as a micro-processing chip, a firmware circuit or a digital storage medium with several programming codes. The recording unit 340 is used for recording any type of data, and can be realized by such as a hard disc, a memory or an optical disc.

Figure 3:
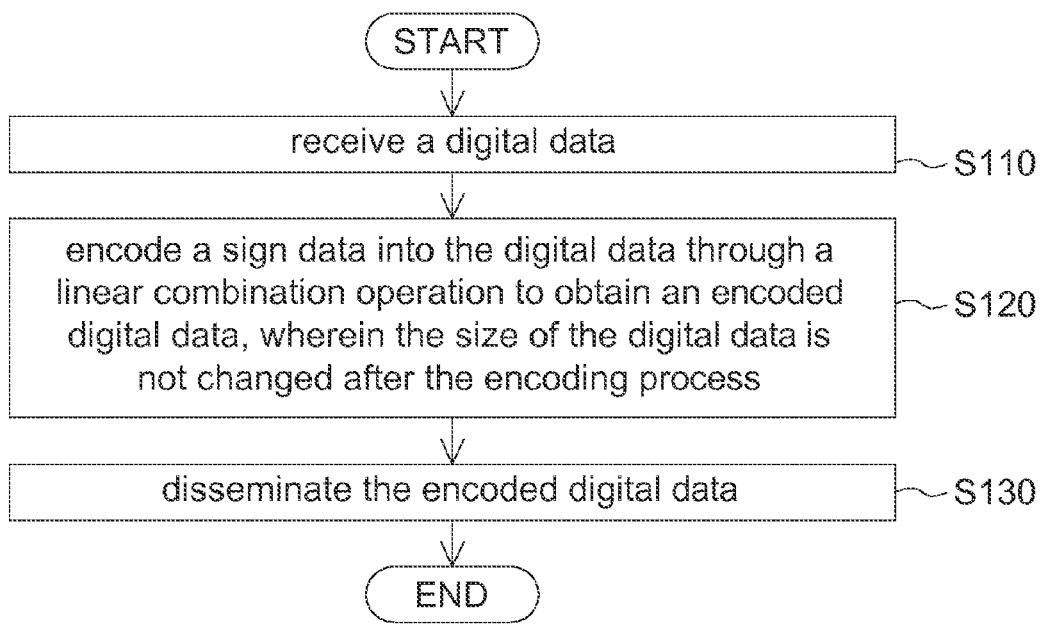
FIG. 3 shows a flowchart of a method for encoding digital data according to an embodiment of the present disclosure.

Referring to FIG. 2 and FIG. 3. FIG. 3 shows a flowchart of a method for encoding digital data according to an embodiment of the present disclosure. The operations of a data dissemination device 300 are elaborated below with an accompanying flowchart. However, anyone who is skilled in the technology of the method for encoding digital data of the present disclosure will understand that the embodiment of the present disclosure is not restricted to be used in the data dissemination device 300 of FIG. 2. The data dissemination device 300 of an embodiment of the present disclosure is not restricted to be used in the flowchart of FIG. 3.

Firstly, in step S110, a digital data D is received by the reception unit 310 of the data dissemination device 300, wherein the digital data D may be outputted by a data managing device 200 (illustrated in FIG. 1) or any data dissemination devices 300. The digital data D may contain many data, such as an advertisement, a book borrowing record, an electronic book, a sports equipment hiring record or a computer programming file.

When the digital data D contains an advertisement, the advertisement can be quickly disseminated during the dissemination process of the digital data D, and the sign data S concealed in the digital data D can be used for tracking which data dissemination devices 300 assist in the dissemination so that suitable rewards can be given.

When the digital data D contains a book borrowing record, book does not need to be returned to the library or filed on the bookshelf, and instead can be directly circulated between the borrowers who also play the role as a data dissemination device 300. When the book is finally circulated to the data managing device 200 (illustrated in FIG. 1) who plays the role as a library, the data managing device 200 can track the sign data S to know who has ever borrowed the book.

Then, in step S120, the sign data S is encoded into the digital data D to obtain an encoded digital data D through a linear combination operation performed by the encoding operation unit 320. The sign data S is exclusive to the data dissemination device 300. That is to say, there will be a million of different sign data S if the data disseminating system 1000 contains a million of data dissemination devices 300. The relationships between the sign data S and the data dissemination device 300 are pre-stored in the data managing device 200.

In the present step, the size of the digital data before encoding is the same with that of the sign data, and size of the digital data D is not changed after the encoding process, so the data volume for transmission will not increase along with the increase in the number of dissemination. That is to say, despite the digital data D is disseminated for one million times, the size of the digital data D will still not changed.

Moreover, after a number of dissemination, the sign data S is already concealed in the digital data D, and cannot be removed from the digital data D.

As indicated in FIG. 2, the encoding operation unit 320 of an embodiment of the present disclosure includes an add calculator 321 and a mod calculator 322. The add calculator 321 is used for executing an addition operation. The mod calculator 322 is used for executing a mod operation. The digital data D and the sign data S are binary data or are elements belonging to the finite field GF ($p''$).

If the digital data D is a 3-bit binary data, the digital data D received by the reception unit 310 of the data dissemination device 300 is "110", and the sign data S of the data dissemination device 300 is "100", then the process of encoding the sign data S into the digital data D is disclosed as follows:

1. An addition operation is applied to the first binary numbers "1" and "1" counted from the left of the two data by the add calculator 321, and the obtained sum is a binary number "10".

2. A mod operation is applied to the binary number [10] being a dividend and the binary number "10" being a divider by the mod calculator 322, and the obtained remainder is a binary number "0" which is the first bit counted from the left of the encoded digital data D.

3. An addition operation is applied to the second numbers "1" and "0" counted from the left of the two data by the add calculator 321, and the obtained sum is a binary number "1".

4. A mod operation is applied to the binary number "1" being a dividend and the binary number "10" being a divider by the mod calculator 322, and the obtained remainder is a binary number "1", which is the second code counted from the left of the encoded digital data D.

5. An addition operation is applied to the third binary numbers "0" and "0" counted from the left of the two data by the add calculator 321, and the obtained sum is a binary number "0".

6. A mod operation is applied to the binary number "0" being a dividend and the binary number "10" being a divider by the mod calculator 322, and the obtained remainder is a binary number "0", which is the third code counted from the left of the encoded digital data D.

Lastly, the sign data S (that is, "100") is encoded into the digital data D (that is, "110") through the addition operation and the mod operation to obtain the encoded digital data D (that is, "010"). In the present embodiment, the sign data S (that is, "100") and the digital data D (that is, "110") are both binary data, so that Exclusive-OR (XOR) operation can be directly applied thereto (that is, 100⊕110=010). However, the sign data S and the digital data D are not necessarily binary data. Any finite field denoted as GF ($p''$) can be used as an operating field of the sign data S and the digital data D, wherein p denotes a prime number, n is an integer larger than or equal to 1. In the finite field, the operations of the add calculator and the mod calculator are the same with the addition operation and the mod operation defined in the finite field.

As disclosed above, the digital data before encoding D, the encoded digital data D and the sign data S are all 3-bit data, so the data volume of the encoded digital data D does not increase after the encoding process. Also, the sign data S cannot be easily obtained from the encoded digital data D.

Then, in step S130, the encoded digital data D is disseminated to another data dissemination device 300 or the data managing device 200 by the dissemination unit 330 of the data dissemination device 300.

Figure 4:
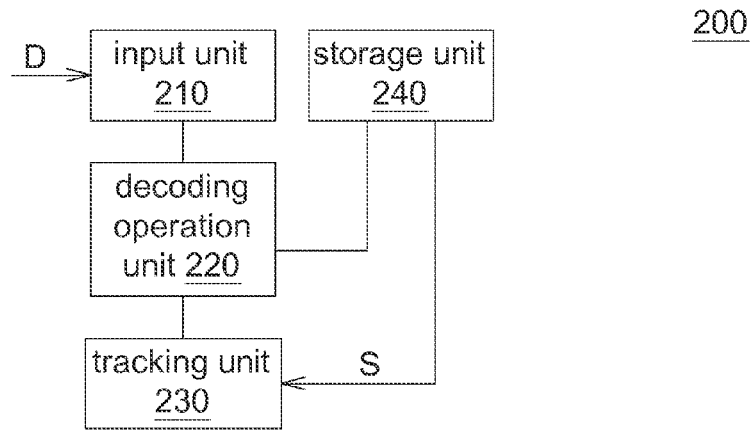
FIG. 4 shows a block diagram of a data managing device.

Referring to FIG. 4, a block diagram of a data managing device 200 is shown. Let the data managing device 200 be taken for example. The data managing device 200 includes an input unit 210, a decoding operation unit 220, a tracking unit 230 and a storage unit 240. The input unit 210 is used for inputting any types of data, and can be realized by such as a cabled network module, a wireless network module, a wireless disseminating module, a keyboard, a mouse or a touch panel. The decoding operation unit 220 is used for executing the decoding procedures. The tracking unit 230 is used for locating a particular data dissemination device 300 corresponding to a particular sign data S. The decoding operation unit 220 and the tracking unit 230 are realized by such as a micro-processing chip, a firmware circuit or a digital storage medium with several programming codes. The storage unit 240 is used for storing any types of data, and can be realized by such as a hard disc, a memory or an optical disc.

Figure 5:
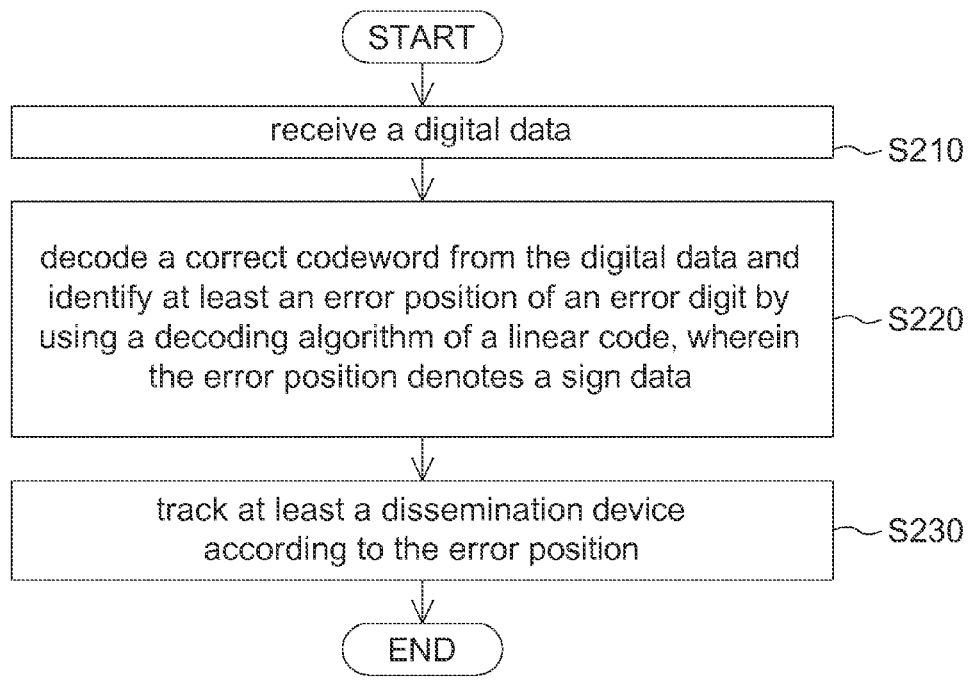
FIG. 5 shows a flowchart of a method for decoding digital data according to an embodiment of the present disclosure.

Referring to FIG. 4 and FIG. 5. FIG. 5 shows a flowchart of a method for decoding digital data according to an embodiment of the present disclosure. The operation of the data managing device 200 is disclosed below with an accompanying flowchart. However, anyone who is skilled in the technology of the method for decoding digital data of the present disclosure will understand that the embodiments of the present disclosure are not limited to be used in the data managing device 200 of FIG. 4, and the operation of the data managing device 200 of an embodiment of the present disclosure is not limited to the flowchart of FIG. 5.

Firstly, in step S210, a digital data D is received by the input unit 210 of the data managing device 200, wherein the digital data D can be directly disseminated via one of the data dissemination devices 300 or user's manual input.

Next, in step S220, a correct codeword is decoded from the digital data and at least an error position of an error digit is identified by the decoding operation unit 220 using a decoding algorithm of a linear code, wherein the error position denotes a sign data S. Each sign data S is exclusive to a specific data dissemination device 300. The correspondence table of the sign data S and data dissemination device 300 is stored in the storage unit 240.

In an embodiment, the storage unit 240 pre-stores a set of codeword consisting of the linear code. The set is expressed as: {000000, 100110, 010011, 001111, 110101, 101001, 011100, 111010}. Moreover, the storage unit 240 also stores a parity check matrix $$H = \begin{bmatrix} 1 & 1 & 0 \\ 0 & 1 & 1 \\ 1 & 1 & 1 \\ 1 & 0 & 0 \\ 0 & 1 & 0 \\ 0 & 0 & 1 \end{bmatrix}$$

of the linear code. Moreover, the storage unit 240 also stores a set of sign data S corresponding to 6 data dissemination device 300. The set is expressed as: {110, 011, 111, 100, 010, 001}. Each sign data S comes from a row of the parity check matrix.

In an embodiment of the present disclosure, if the digital data D received by the input unit 210 of the data managing device 200 is "110", then the process of decoding the sign data S by a decoding algorithm of the linear code is disclosed as follow:

1. A vector w satisfying the equation wH=[110] is calculated, and the vector w obtained after calculation is [000110].

2. A vector v0 with least number of difference bits with respect to the vector w is located from a set of codeword {000000, 100110, 010011, 001111, 110101, 101001, 011100, 111010}. For example, since the vector [000110] and the vector [100110] only differ in the first bit, there is only 1 difference bit. The correct codeword of the vector v0 obtained after calculation is [100110].

3. An Exclusive-OR (XOR) operation is applied to the vector w and the vector v0 to obtain an error position vector vf [100000].

4. In the error position vector vf [100000], only the first bit is "1". This implies that error digit occurs to the first position, so the sign data S once encoded into the digital data D is the first sign data "110".

Then, in step S230, one data dissemination device 300 corresponding to the sign data S (that is, "110") is identified from the set {110, 011, 111, 100, 010, 001} of the sign data S corresponding to the 6 data dissemination devices 300 by the tracking unit 230.

It is possible that more than one error position is obtained in step S220. Thus, in step S230, the tracking unit 230 will track a number of corresponding data dissemination devices 300.

In the above example that the digital data D contains an advertisement, the data dissemination devices 300 which have executed a coding procedure and assisted in data dissemination will be tracked out, so the advertisement company can reward the owners of the vehicles in which the data dissemination devices 300 are installed.

In the above example of book borrowing, all the readers who have ever borrowed books will be tracked out, and the library can take the book borrowing record accordingly.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for encoding digital data capable of tracking data dissemination device, comprising:
   (a) receiving a digital data by a first data dissemination device;
   (b) encoding a first sign data into the digital data through a linear combination operation to obtain a first encoded digital data by the first data dissemination device, wherein the size of the digital data is not changed after the encoding process;
   (c) disseminating the first encoded digital data by the first data dissemination device;
   (d) receiving the first encoded digital data by a second data dissemination device;
   (e) encoding a second sign data into the first encoded digital data through the linear combination operation to obtain a second encoded digital data by the second data dissemination device, wherein the size of the first encoded digital data is not changed after the encoding process; and
   (f) disseminating the second encoded digital data by the second data dissemination device;
   wherein a data managing device receives the second encoded digital data, the data managing device decodes a correct codeword from the second encoded digital data and identifies at least two error positions of error digits, the at least two error positions denote the first sign data and the second sign data, and the data managing device tracks the first data dissemination device and the second data dissemination device according to the two error positions.

2. The method for encoding digital data capable of tracking data dissemination device according to claim 1, wherein in the step (b), the size of the digital data before encoding is the same with that of the first sign data; in the step (e), the size of the first encoded digital data is the same with that of the second sign data.

3. The method for encoding digital data capable of tracking data dissemination device according to claim 1, wherein in the step (a) and the step (b), the digital data and the first sign data are binary data or are elements belonging to a finite field GF (pn).

4. The method for encoding digital data capable of tracking data dissemination device according to claim 1, wherein in the step (b), the first sign data is encoded into the digital data through an addition operation and a mod operation.

5. The method for encoding digital data capable of tracking data dissemination device according to claim 1, wherein in the step (a), the digital data comprises an advertisement.

6. A data dissemination device, comprising:
   a reception unit used for receiving a first encoded digital data;
   an encoding operation unit used for encoding a second sign data into the first encoded digital data through a linear combination operation to obtain a second encoded digital data, wherein the size of the first encoded digital data is not changed after the encoding process;
   a dissemination unit used for disseminating the second encoded digital data;
   wherein, the first encoded digital data is disseminated by another data dissemination device, the another data dissemination device receives a digital data and encodes a first sign data into the digital data through the linear combination operation to obtain the first encoded digital data, a data managing device receives the second encoded digital data, the data managing device decodes a correct codeword from the second encoded digital data and identifies at least two error positions of error digits, the at least two error positions denote the first sign data and the second sign data, and the data managing device tracks at least two data dissemination devices according to the two error positions.

7. The data dissemination device according to claim 6, wherein the digital data, the first sign data, the second sign data, the first encoded digital data and the second encoded digital data are binary data or are elements belonging to a finite field GF ($p''$).

8. The data dissemination device according to claim 6, wherein the encoding operation unit comprises:
   an add calculator used for executing an addition operation; and
   a mod calculator used for executing a mod operation;
   wherein, the second sign data is encoded into the first encoded digital data through the addition operation and the mod operation.

* * * * *